United States Patent
Terada

[11] Patent Number: 6,048,767
[45] Date of Patent: Apr. 11, 2000

[54] METHOD OF FORMING A SEMICONDUCTOR MEMORY DEVICE

[75] Inventor: Kazuo Terada, Tokyo, Japan

[73] Assignee: NEC Corporation, Tokyo, Japan

[21] Appl. No.: 08/964,416

[22] Filed: Nov. 4, 1997

Related U.S. Application Data

[62] Division of application No. 08/732,832, Oct. 15, 1996, Pat. No. 5,769,452, which is a continuation of application No. 08/591,105, Jan. 25, 1996, abandoned, which is a continuation of application No. 08/104,499, Aug. 10, 1993, abandoned, which is a continuation of application No. 07/933,099, Aug. 21, 1992, abandoned.

[30] Foreign Application Priority Data

| Aug. 22, 1991 | [JP] | Japan | 3-209671 |
| Aug. 22, 1991 | [JP] | Japan | 3-209681 |
| Dec. 2, 1991 | [JP] | Japan | 3-318167 |
| Dec. 20, 1991 | [JP] | Japan | 3-338657 |
| Dec. 25, 1991 | [JP] | Japan | 3-342784 |

[51] Int. Cl.[7] .................................. H01L 21/336
[52] U.S. Cl. ..................... 438/262; 438/242; 438/424
[58] Field of Search ........................ 438/242, 243, 438/244, 259, 262, 270, 386, 396, 424, 427, 589, 278, 282, 296, 524, 526

[56] References Cited

U.S. PATENT DOCUMENTS

| 3,992,686 | 11/1976 | Canning | 333/238 |
| 4,292,600 | 9/1981 | Neracher | 372/84 |
| 4,622,551 | 11/1986 | Kupersmith et al. | 340/825.06 |
| 4,638,458 | 1/1987 | Itoh | 365/51 |
| 4,683,486 | 7/1987 | Chatterjee | 257/301 |
| 4,786,954 | 11/1988 | Morie et al. | 357/23.6 |
| 4,811,067 | 3/1989 | Fitzgerald et al. | 257/301 |
| 4,845,539 | 7/1989 | Inoue | 357/23.6 |
| 4,921,815 | 5/1990 | Miyazawa | 438/248 |
| 4,953,125 | 8/1990 | Okumura et al. | 365/149 |
| 4,989,055 | 1/1991 | Redwine | 257/302 |
| 5,013,679 | 5/1991 | Kumagai et al. | 438/388 |
| 5,016,070 | 5/1991 | Sundaresan | 257/302 |
| 5,047,815 | 9/1991 | Yasuhira et al. | 357/23.6 |
| 5,065,273 | 11/1991 | Rajeevakumar | 438/386 |
| 5,156,992 | 10/1992 | Teng et al. | 438/242 |
| 5,169,795 | 12/1992 | Nishizawa et al. | 438/270 |
| 5,244,824 | 9/1993 | Sivan | 438/270 |

*Primary Examiner*—Charles Bowers
*Assistant Examiner*—Jack Chen
*Attorney, Agent, or Firm*—Burns, Doane, Swecker & Mathis, LLP

[57] ABSTRACT

Disclosed are an improved semiconductor memory cell suitable for high integration and a novel method of fabricating the same. The memory cell has a large capacitance and a small area. The memory cell also has a plurality of bit-lines buried in an isolation region in a semiconductor substrate. The bit-line has a very small width and thickness thereby reducing a parasitic capacity between the bit-line and the semiconductor substrate. The memory cell may further be provided with a noise shielding line. Further, disclosed is a novel memory cell array of a semiconductor memory. The buried bit-line is coupled with a bit-line connecting sub-arrays and both are separated by a insulation film. A plurality of pairs of the bit-lines are arranged in rows. A word-line is coupled with a sub-word line and both are separated by a insulation film. A plurality of pairs of the word-lines are arranged in columns. The memory cells are arranged at the intersections of the buried bit-lines and the word-lines. The memory cells are also alternatively arranged on the adjacent buried bit-lines so that the number of the memory cells arranged on one of the buried bit-lines are reduced.

9 Claims, 18 Drawing Sheets

125a  125b  125a  125b 125a  125b

METHOD OF FORMING A SEMICONDUCTOR MEMORY DEVICE

This application is a divisional, of application Ser. No. 08/732,832, filed Oct. 15, 1996 U.S. Pat. No. 5,769,452; which is a continuation of application Ser. No. 08/591,105 filed Jan. 25, 1996 now abandoned; which is a continuation of application Ser. No. 08/104,499 filed Aug. 10, 1993 now abandoned; which is a continuation of application Ser. No. 07/933,099, filed Aug. 21, 1992 now abandoned.

BACKGROUND OF THE INVENTION

This invention relates to a semiconductor memory cell, and a method of fabrication thereof, and a semiconductor memory cell array.

Semiconductor memory cells which comprise a single transistor and a single capacitor (hereinafter referred to as a 1T cell) has been used for a high integrated semiconductor memory. In general, it is desired that the 1T cell has a large output voltage and a small area for high integration. An output voltage of the 1T cell is approximately proportional to $C_S/(C_S+C_B)$, where $C_S$ is the cell capacitance and $C_B$ is the parasitic capacitance between the bit-line and a semiconductor substrate. To realize high integration, it is preferable that the 1T cell has a small area but a large capacitance. Further, it is desirable that a bit-line has a small parasitic capacity.

Such a 1T cell having a small area and a large capacitance has been proposed. For instance, a 1T cell including a stacked capacitor (hereinafter referred to as a stacked capacitor cell) is one Example. A stacked capacitor cell is disclosed in T. Ema at al., 1988 International Electron Devices Meeting p.592 "3-dimensional stacked capacitor cell for 16M and 64M DRAMs".

FIGS. 1A and 1B illustrate the stacked capacitor cell which comprises a transistor and a stacked capacitor having two fins 17a and 17b provided on a substrate 1. In FIG. 1B, a capacitor comprises an electrode having the two fins 17a and 17b, a capacitive insulation film (not shown) and an opposite electrode 19. A structure of the two fins 17a and 17b permits the stacked capacitor to have a high capacitance on a small area due to a large interface of the electrodes. While, the transistor comprises two diffusion regions serving as source/drain regions 14-1 and 14-2, and a word-line 13 serving as a gate. A layer 12 may serve as a gate insulation layer. A bit-line 20 is in contact with either the source region or the drain region. Layers 8, 12, 21 and 22 serve as insulation layers respectively. A layer 23 serves as a protection layer.

It is, therefore, understood that the set forth stacked capacitor cell has a large capacitance over a small occupied area, which is suitable for high integrated semiconductor memories. The stacked capacitor cell has, however, a problem in an arrangement of a capacitor contact hole CO2 between the transistor and the stacked capacitor. The capacitor contact hole is so arranged as not to contact with the bit-lines and the word-lines. Further, the capacitor contact hole is filled with a conductive material to form a capacitor contact. To realize a higher integration, it is required that the contact hole have a diameter as small as possible and arrange-s in the vicinity of the word-line 13 and the bit-line 20. Further, the contact hole is required to have a large depth due to the insulation layers 21 and 22. It is, however, difficult to fill the very slender contact hole with the conductive material.

To combat the set forth problems in the arrangement of the capacitor contact hole, a memory cell was proposed in which a bit-line is buried in an isolation region. One such memory cell is disclosed in 1990 Symposium on VLSI Technology, Y. Kohyama at al., "Buried Bit-Line Cell for 64 MB DRAMs". In this memory cell, the contact hole between a bit-line and one of transistor source/drain electrodes is formed in the insolation region. While, the contact hole between a capacitor and another transistor source/drain electrodes is formed in the insulation layer in the same way of the set forth memory cell.

In the memory cell, the capacitor contact hole is so aligned as not to contact with the word-line only because the bit-line is buried in the isolation region, thereby substantially reducing the difficulty in the arrangement of the capacitor contact hole.

The memory cell is, however, engaged with another problem in a large parasitic capacity between the bit-line and the semiconductor substrate. The bit-line buried in an isolation region is surrounded by the insulation material, thereby resulting in a large parasitic capacity between the bit-line and the semiconductor substrate. The large parasitic capacity is undesired to have a required output voltage on a small memory cell area which is suitable for higher integration. The large parasitic capacity is also undesirable for a high speed performance of the memory. The large parasitic capacity is also associated with a bit-line length. It is, thus, desirable to reduce the bit-line length.

On the other hand, to combat the set forth problem in the arrangement of the capacitance contact hole for high integration, it may also be considered that the bit-line and the word-line are taken into a smaller width and thickness. Such a bit-line and word-line, however, have a relatively large resistance which is undesirable for high speed performance of the memory Further, the bit-line is made of a material having a relatively large specific resistance.

To realize a higher integration, it is required that many memory cells are integrated. This, however, requires a large bit-line length which provide the undesired large parasitic capacitance and large resistance thereof. In general, the large resistance and the parasitic capacity of the bit-line are also associated with the length thereof. It is, then, desired to reduce the bit-line and word-line length. If it is not so, many bit-lines and sense amplifiers are required thereby preventing a higher integration.

In addition, when a bit-line arrangement is taken into a very small pitch for the higher integration, a problem in a noise caused by a parasitic capacity between bit-lines is considerable. Such a noise caused by the parasitic capacity between bit-lines provides undesirable influences to a bit-line signal read performance. It is, therefore, desirable to reduce and shield such a bit-line noise. The bit-line noise is also associated with a parasitic capacity between bit-lines. It is also desirable for a noise reduction to reduce the parasitic capacity between bit-lines.

SUMMARY OF THE INVENTION

Accordingly, it is a primary object of the present invention to provide an improved semiconductor memory cell and a memory cell array capable of higher integration and a novel method of fabricating the same.

It is another object of the present invention to provide a memory cell structure having a small area and a large capacitance and a method of fabricating the same.

It is still another object of the present invention to provide a memory cell structure capable of reducing a parasitic capacity between a bit-line and a semiconductor substrate and a method of fabricating the same.

It is a further object of the present invention to provide an arrangement of bit-lines and word-lines for higher integration.

It is a still further object of the present invention to provide a memory cell array capable of reducing a parasitic capacity between a bit-line and a semiconductor substrate for higher integration and an improved stability of reading out performance.

It is yet a further object of the present invention to provide a memory cell array capable of reducing a resistance of a bit-line for higher integration and an improved stability of a reading out performance.

It is a further more object of the present invention to provide a memory cell structure capable of reducing and shielding a bit-line noise caused by a parasitic capacity between bit-lines and a method of fabricating the same.

The above and other objects, features, and advantages of the present invention will be apparent from following descriptions.

There are provided a novel memory cell structure including a plurality of bit-lines buried in an isolation region, which have a very small width and thickness and a method of fabricating the same.

A fabrication process of the bit-line in the memory cell essentially comprises following steps. A semiconductor substrate is prepared to form a memory cell. A plurality of trench grooves are formed in the semiconductor substrate. The trench groove will serve as a portion of an isolation region including bit-lines. An insulation film is formed on an entire surface of the semiconductor substrate, after which a conductive thin film is formed on the insulation film followed by anisotropic etching so that the conductive thin film remains on opposite side walls of the trench groove. The remaining portions of the conductive film may serve as bit-lines. Subsequently, the trench groove is filled with an insulation material to complete bit-lines formation.

A bit-line width is defined by a conductive film thickness which may easily be controlled to be made very thin. A bit-line thickness is defined by a trench groove depth. The bit-line may, therefore, have a very small width and thickness thereby reducing the parasitic capacity between the bit-line and the semiconductor substrate.

In addition, the bit-line is also buried in the isolation region, or the trench groove whereby reducing a difficulty in an arrangement of a contact hole between a transistor and a capacitor.

There is further provided a novel memory cell structure including, a bit-line and a noise shielding line which are buried in the isolation region. The bit-line and the noise shielding line exist at opposite side walls of the isolation region. The shielding line is taken into a constant potential thereby reducing a noise caused by the parasitic capacitance between bit-lines.

Subsequently, a surface of the device is made into a flat surface followed by an etch back to have the insulation material remain within the trench groove. A silicon nitride film is formed on an active region of the substrate before a field oxide film is formed on an opposite area to the active region thereby defining the active area. After that, the insulation film of the active area are removed. Further, the silicon nitride film and the insulation film on a wide portion of the trench groove formed at an active area side is removed so as to expose one of the remaining conductive films, or bit-line. After that, a conductive material is deposited on the exposure area to be made into contact with the bit-line followed by patterning.

Subsequently, a gate insulation film, a word-line, source/drain regions, a stacked capacitor, insulation films are formed by normal processes.

In the structure, a field oxide film is formed on a surface of the semiconductor substrate to define the active area. A plurality of diffusion regions formed in the active area of the semiconductor substrate may serve as source/drain regions. A gate insulation film is provided on the active area of the semiconductor substrate. A word-line provided on the gate insulation film may serves as a gate thereby forming a transistor for a switching device. One of the source/drain regions is connected to the buried bitline through the conductive material. Another source/drain region is connected to one of capacitor electrodes through a contact hole. The one electrode may serve as a storage electrode of the capacitor. An opposite electrode of the capacitor is provided through a capacitive insulation film on the one electrode thereby forming a stacked capacitor. From the set forth description, it is understood that the 1T cell comprising a sole transistor and a sole capacitor is formed in the active area.

In the operation of the memory cell, a voltage signal is stored in the storage electrode of the stacked capacitor. When a gate signal is applied to the word-line, the MOS transistor is taken into a ON state. The voltage signal is derived through the MOS transistor to the bit-line thereby resulting in the reading out performance.

Additionally, there is provided a novel memory cell array including the bit-lines and the word-lines. A memory cell array according to the present invention comprises a plurality of sub-arrays which are connected each other through bit-lines. One of the sub-arrays is connected through the bit-lines to a plurality of sense amplifiers. The sub-array essentially comprises a plurality of pairs of a buried bit-line and a bit-line arranged in rows, a plurality of pairs of a word-line and a sub-word line arranged in columns, a sub-array selective line arranged in column and a plurality of memory cells arranged at the intersections of the buried bit-lines and the word-lines. The word-lines includes dummy word-lines. The dummy word-lines are provided with dummy memory cells. Further, selective gates are provided at the intersections of the sub-array selective line and the buried bit-lines. The word-line and the sub-word line are connected each other at opposite terminal portions in the sub-array. The buried bit-line is connected with the bit-line at an output terminal side.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

First, there are provided a novel memory cell structure including two bit-lines buried in an isolation region which have a very small width and thickness and a method of fabricating the same.

Figure 3A:
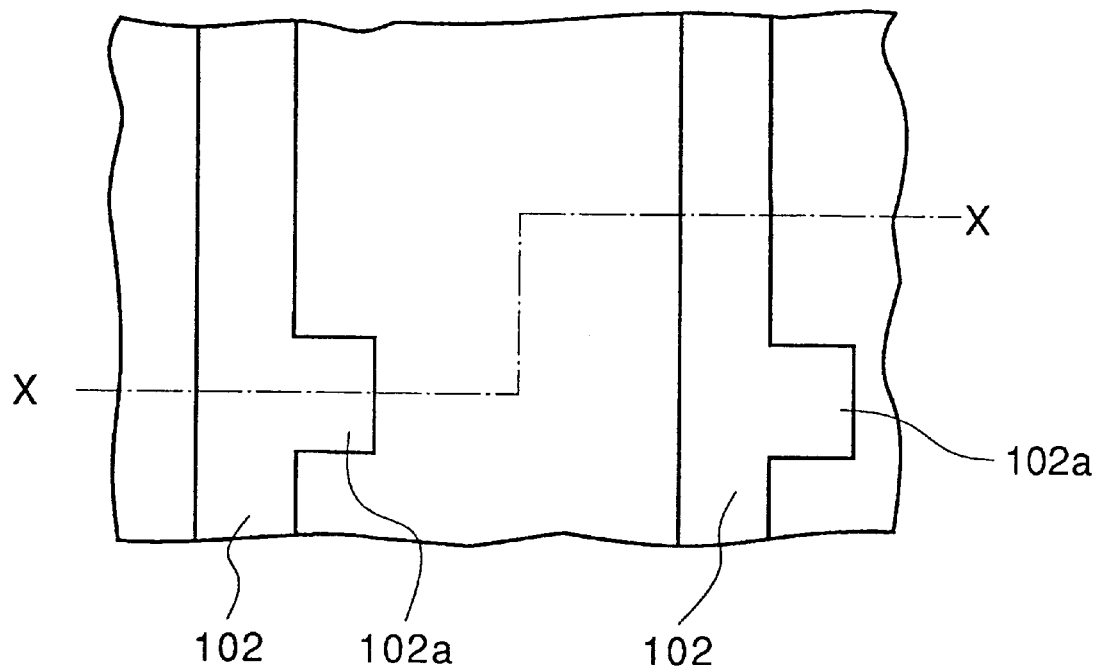
FIG. 3A is a fragmentary plane view illustrative of one step of sequential processes involved in a novel method of fabricating a memory cell according to the present invention.
Figure 3B:
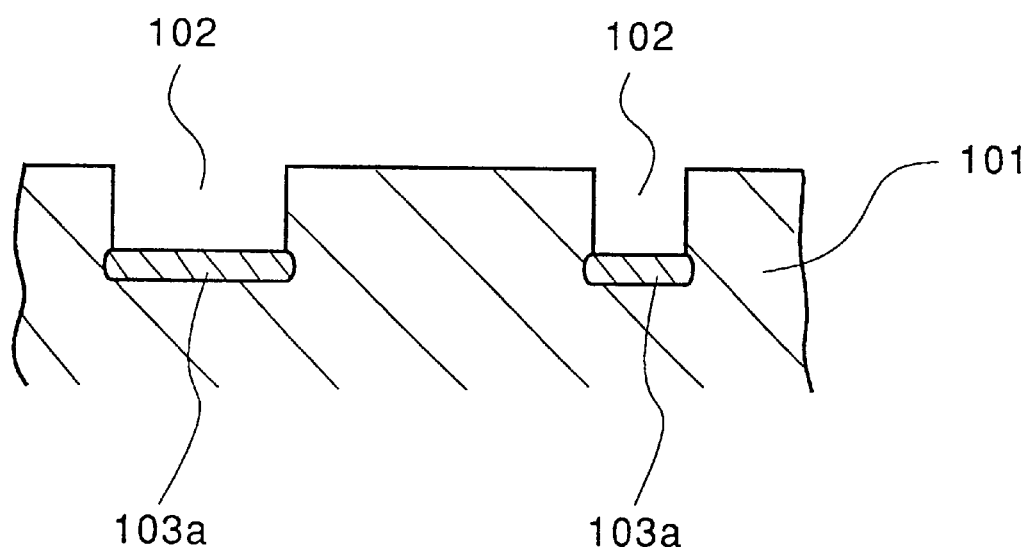
FIG. 3B is a fragmentary cross sectional elevation view illustrative of one step of sequential processes involved in a novel method of fabricating a memory cell, which is taken along the 3B—3B line in FIG. 3A.

In FIGS. 3A and 3B, a p-type silicon crystalline substrate 101 is prepared to form a memory cell. A plurality of trench grooves 102 are formed in the p-type silicon crystalline substrate 101. The trench groove 102 has a wide portion 102a. The trench groove 102 will serve as a portion of an isolation region including the bit-lines 105a and 105b. A channel stopper 103a is formed on a bottom surface of the trench groove 102.

Figure 4:
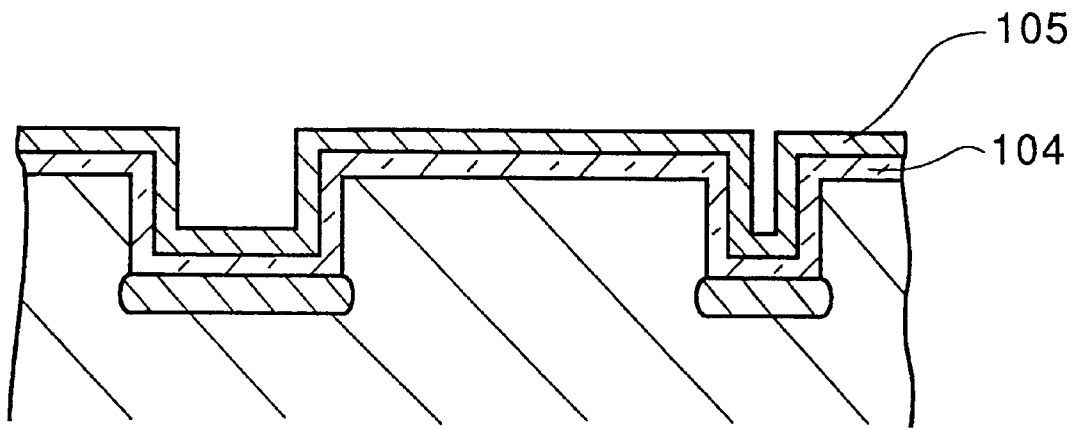
FIG. 4 is a fragmentary cross sectional elevation view illustrative of one step of sequential processes involved in a novel method of fabricating a memory cell according to the present invention.

In FIG. 4, an insulation film 104 is formed on an entire surface of the p-type silicon substrate 101, after which a polycrystalline silicon thin film 105 having a low resistance is formed on the insulation film 104.

Figure 5:
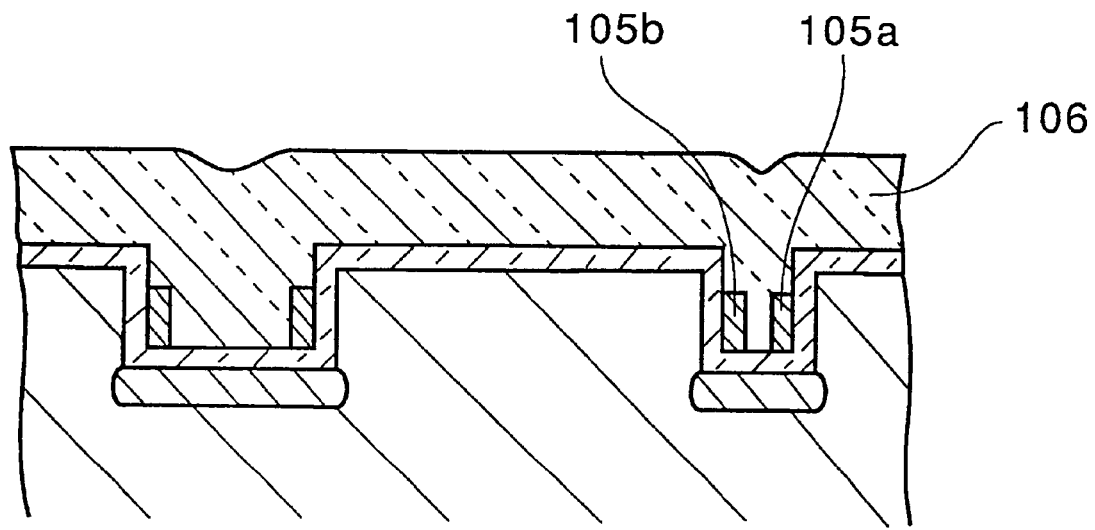
FIG. 5 is a fragmentary cross sectional elevation view illustrative of one step of sequential processes involved in a novel method of fabricating a memory cell according to the present invention.

In FIG. 5, anisotropic etching is carried out so that the polycrystalline silicon thin film remains at opposite side walls of the trench groove 102. The remaining portions of the polycrystalline silicon film 105 may serve as the bit-lines 105a and 105b. Subsequently, the trench groove is filled with an insulation material to form a PSG film 106.

A bit-line width is defined by a thickness of the polycrystalline silicon film 105, which may easily be controlled to be very thin. When the polycrystalline silicon thin film is formed by chemical vapor deposition, an accuracy of the thickness may be controlled within approximately 10 nanometers or smaller. In contrast, when the polycrystalline silicon thin film is formed by lithography, it is difficult to control an accuracy of the thickness of the polycrystalline silicon film within 400 nanometers. A bit-line thickness is defined by a trench groove depth. An accuracy of the depth of the trench groove may be controlled within 50 nanometers. The bit-line may, therefore, have a very small width and thickness thereby reducing the parasitic capacity between the bit-line and the semiconductor substrate, although the bit-line is buried in the isolation region.

In addition, the bit-line is also buried in the isolation region, or the trench groove whereby reducing a difficulty in an arrangement of a contact between a transistor and a capacitor.

Figure 6A:
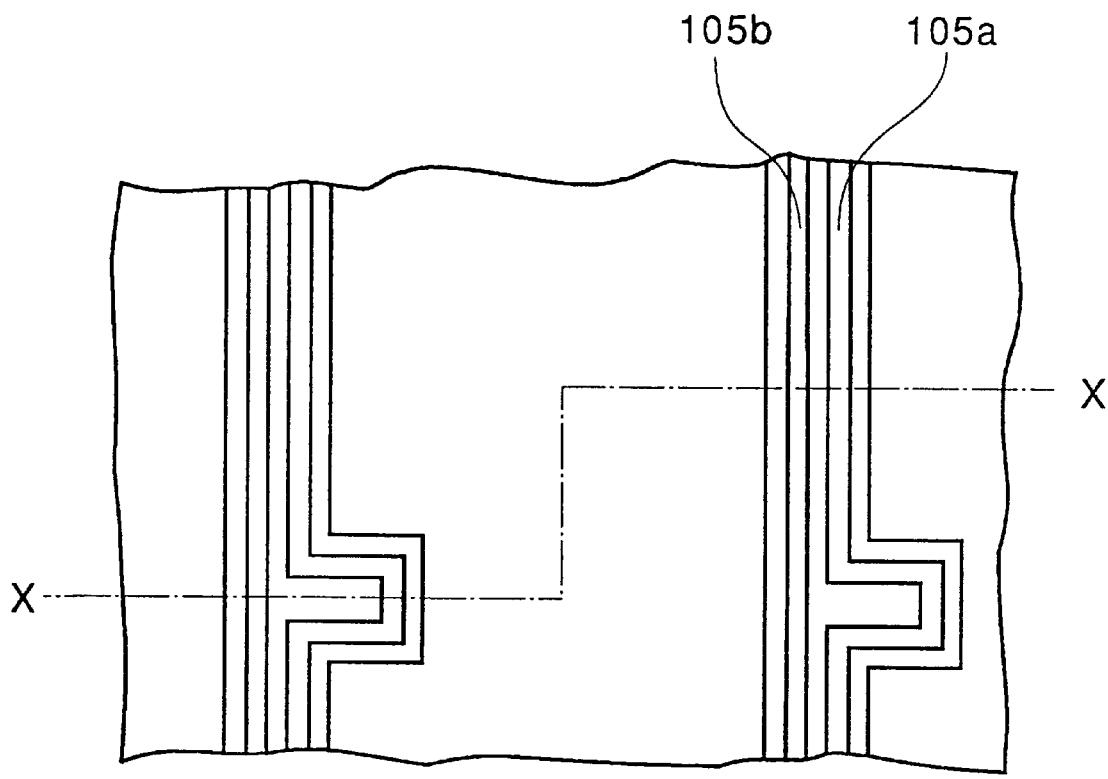
FIG. 6A is a fragmentary plane view illustrative of one step of sequential processes involved in a novel method of fabricating a memory cell according to the present invention.
Figure 6B:
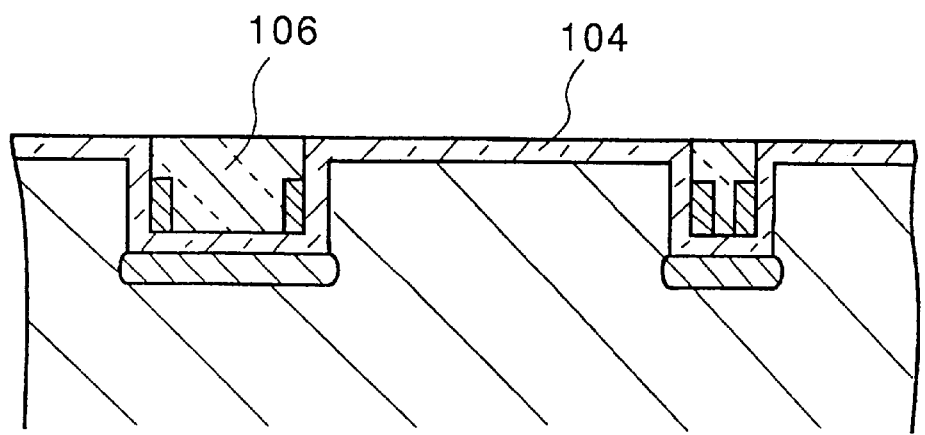
FIG. 6B is a fragmentary cross sectional elevation view illustrative of one step of sequential processes involved in a novel method of fabricating a memory cell, which is taken along the 6B—6B line in FIG. 6A.

In FIGS. 6A and 6B, a surface of the PSG film 106 is made into a flat surface followed by an etch back so that both the insulation film 104 and the PSG film 106 within the trench groove 102 remain. If a surface of the silicon substrate is exposed by the etch back, a thermal oxidization may be carried out to form a silicon oxide film.

Figure 7A:
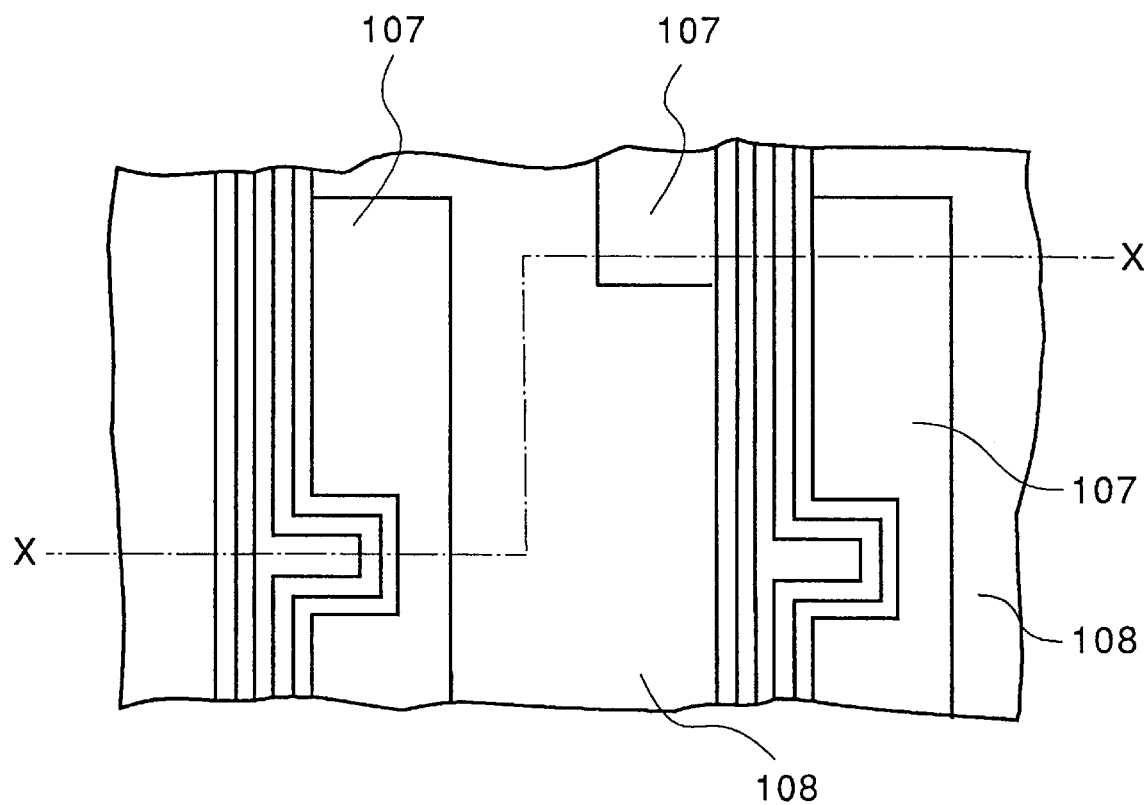
FIG. 7A is a fragmentary plane view illustrative of one step of sequential processes involved in a novel method of fabricating a memory cell according to the present invention.
Figure 7B:
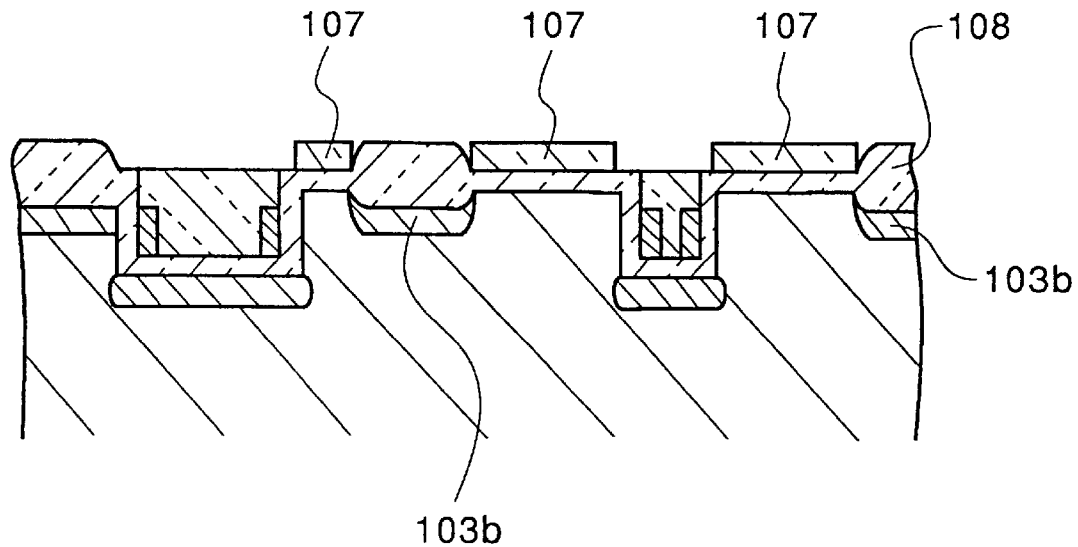
FIG. 7B is a fragmentary cross sectional elevation view illustrative of one step of sequential processes involved in a novel method of fabricating a memory cell, which is taken along the 7B—7B line in FIG. 7A.

In FIGS. 7A and 7B, a silicon nitride film 107 is formed on an active area of the substrate, after which a selective oxidization is carried out to form a field oxide film 108 on an opposite area to the active area thereby defining the active area.

Figure 8A:
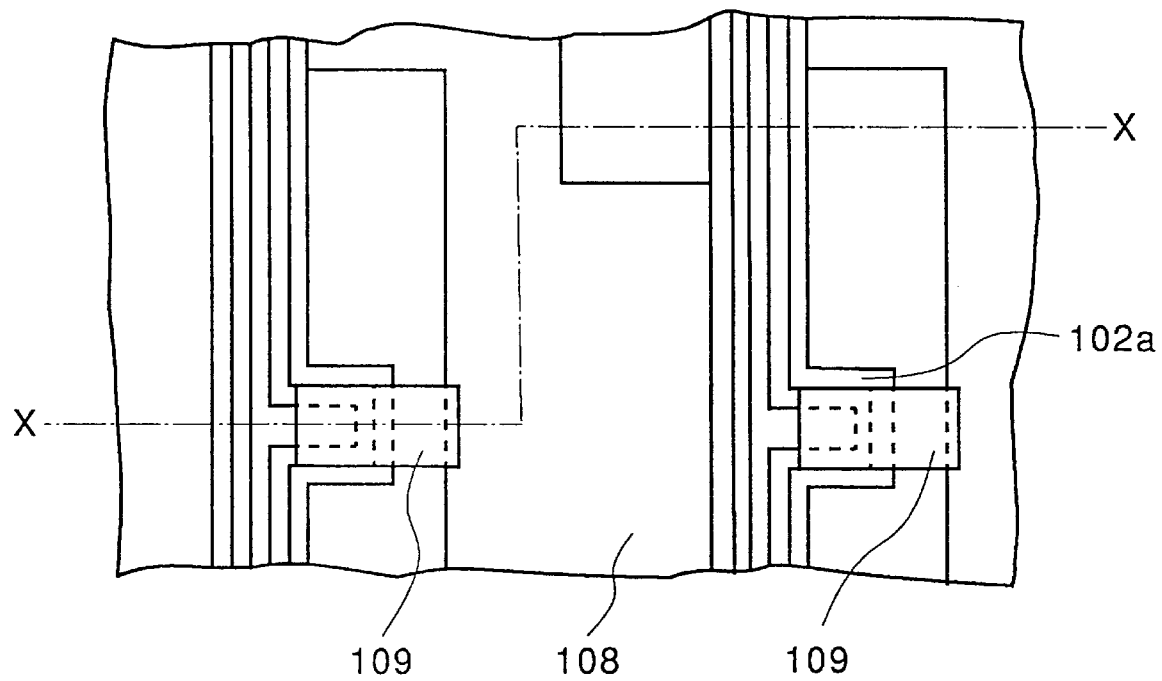
FIG. 8A is a fragmentary plane view illustrative of one step of sequential processes involved in a novel method of fabricating a memory cell according to the present invention.
Figure 8B:
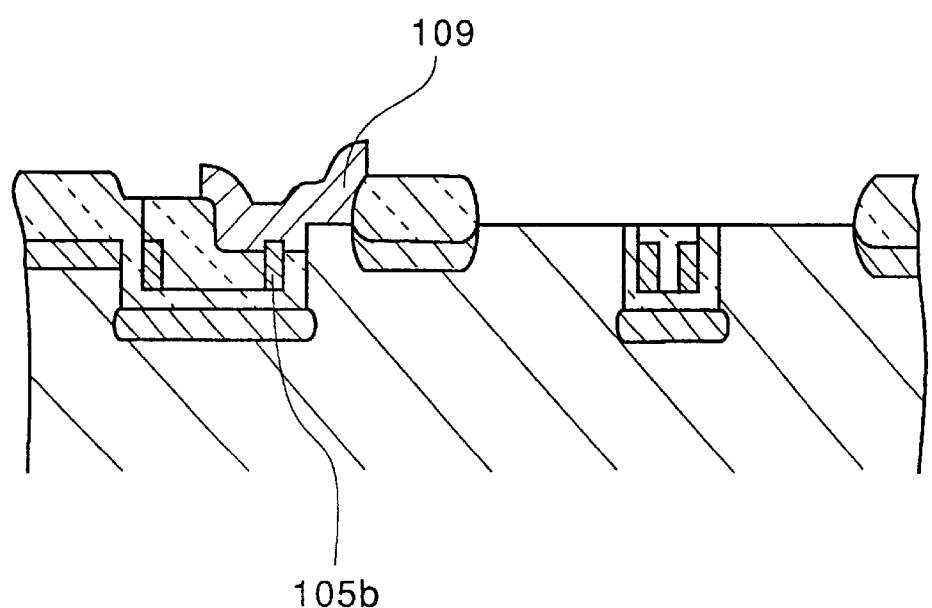
FIG. 8B is a fragmentary cross sectional elevation view illustrative of one step of sequential processes involved in a novel method of fabricating a memory cell, which is taken along the 8B—8B line in FIG. 8A.

In FIGS. 8A and 8B, the silicon nitride film 107 and the insulation film 104 of the active area are removed. Concurrently, the PSG film on the wide portion 102a of the trench groove are removed so as to expose one of the remaining polycrystalline silicon films, or the bit-line 105b. After that, a polycrystalline silicon film 109 having a low resistance which is doped with a n-type dopant is deposited on the exposure area to be made into contact with the bit-line followed by patterning.

Referring back to FIGS. 2A, 2B and 2C, a gate insulation film 110, a low resistance polycrystalline silicon film 111 serving as a word-line, n-type diffusion regions 112-1 and 112-2 serving as source/drain regions, a stacked capacitor 115, 116 and 117, insulation films 113 and 118 are formed by normal processes.

Figure 1A:
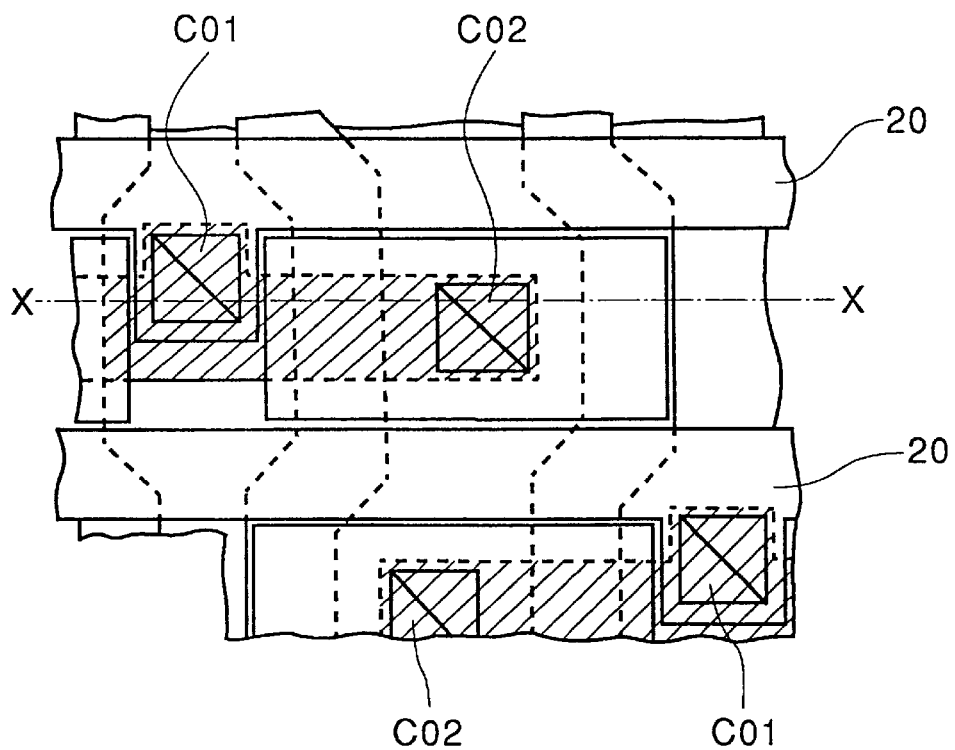
FIG. 1A is a fragmentary plane view illustrative of a conventional structure of memory cells, word-lines and bit-lines in a memory array.
Figure 1B:
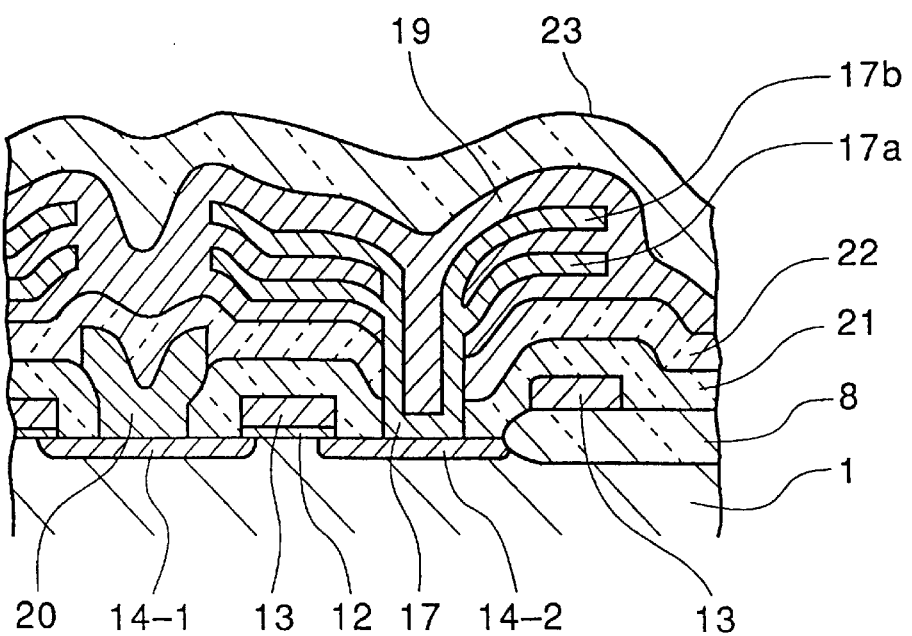
FIG. 1B is a fragmentary cross sectional elevation view illustrative of the conventional memory cell structure taken along the 1B—1B line in FIG. 1A.
Figure 2A:
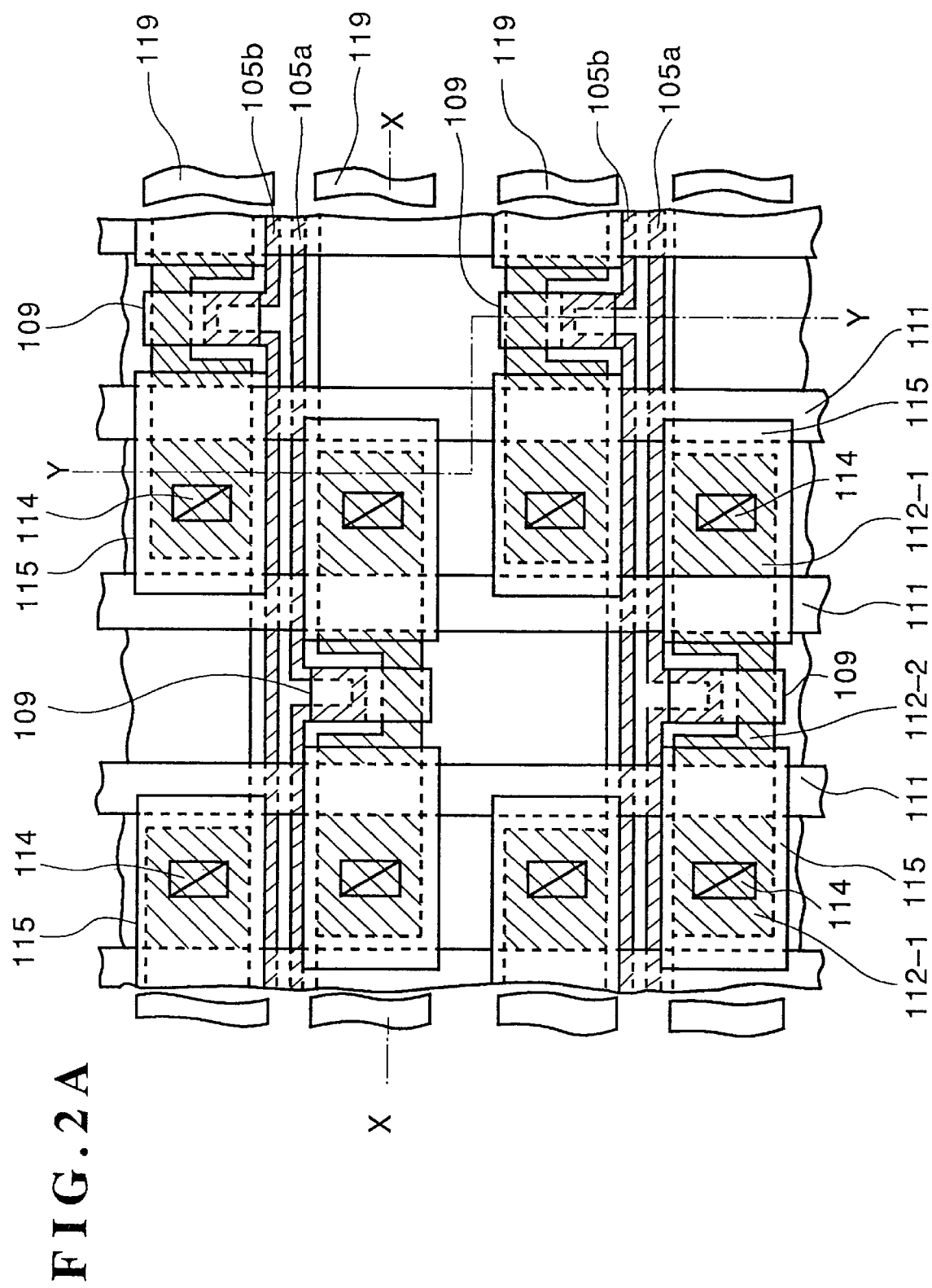
FIG. 2A is a fragmentary plane view illustrative of a novel structure of memory cells, word-lines and bit-lines in a memory cell array according to the present invention.
Figure 2B:
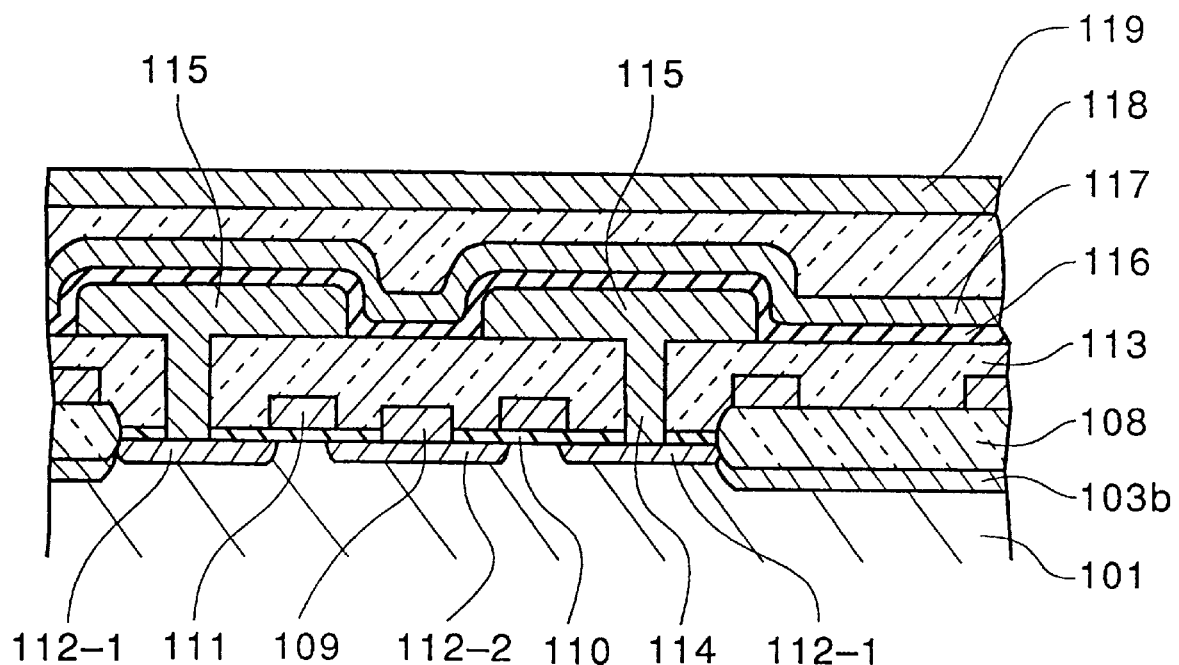
FIG. 2B is a fragmentary cross sectional elevation view illustrative of a novel memory cell structure taken along the 2B—2B line in FIG. 2A according to the present invention.
Figure 2C:
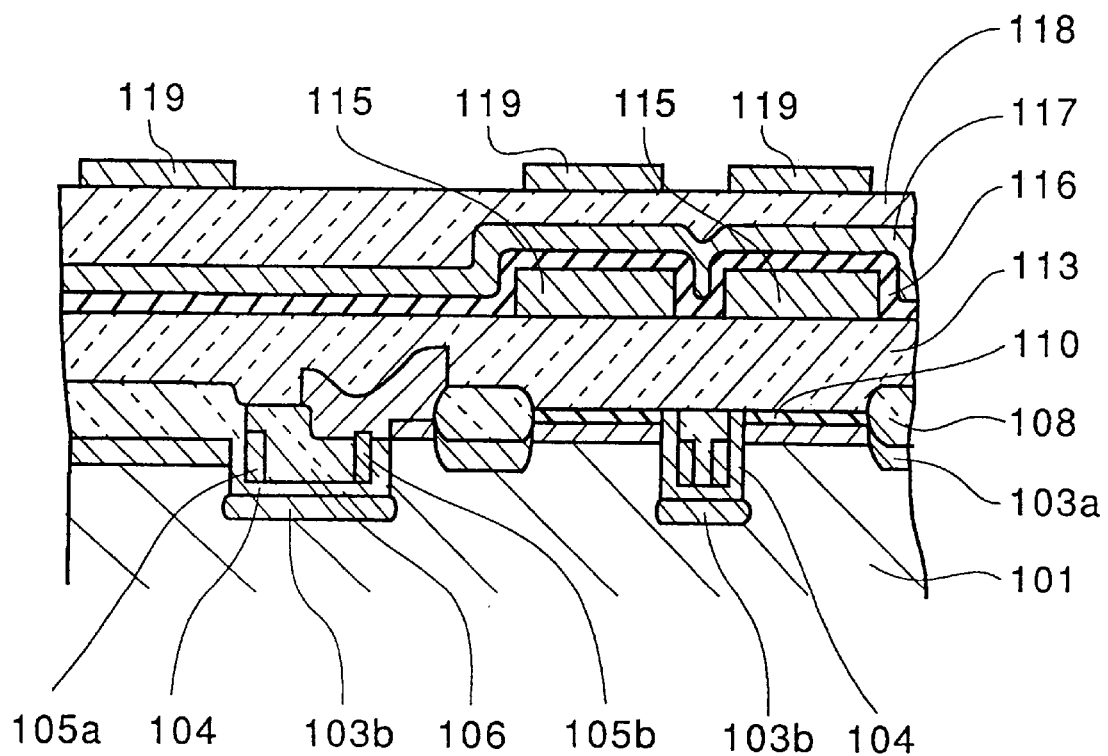
FIG. 2C is a fragmentary cross sectional elevation view illustrative of a novel memory cell structure taken along the 2C—2C line in FIG. 2A according to the present invention.

In the structure shown in FIGS. 2A and 2B, the active area of the p-type silicon substrate 101 is defined by the field oxide film 108. A pair of source and drain regions 112-1 and 112-2 is provided in the active area of the p-type silicon substrate 101. A channel area is defined by the source and drain regions 112-1 and 112-2. The word-line 111 is provided over the channel region through the gate insulation film 110 so as to serve as a gate, thereby forming a MOS or MIS transistor used for a switching device. The source/drain region 112-1 is connected to a storage electrode 115 through a contact hole C1 filled with a conductive material 114. The storage electrode 115 of polycrystalline silicon is covered with a capacitive insulation film 116. A polycrystalline silicon film 117 serving as an opposite electrode overlays the capacitive insulation film 116 thereby forming a stacked capacitor. The source/drain region 112-2 is connected to the bit-line 105b through the polycrystalline silicon film 109 of a low resistance.

In the performance of the memory cell, a voltage signal is stored in the storage electrode 115 of the stacked capacitor. When a gate signal is applied to the word-line 111 serving as the gate, the transistor is taken into a ON state. The voltage signal is derived form the source/drain region 112-1 to the source/drain region 112-2. The voltage signal is, then, derived through the buried bit-line 105b to the bit-line 105a thereby resulting in the reading out performance. When the voltage signal is derived through the bit-line, the shielding line is taken into a constant potential thereby reducing a noise caused by the parasitic capacity between the bit-line and other bit-line.

Second, there are provided a novel memory cell structure including a bit-line and a shielding line which are buried in an isolation region.

Figure 11A:
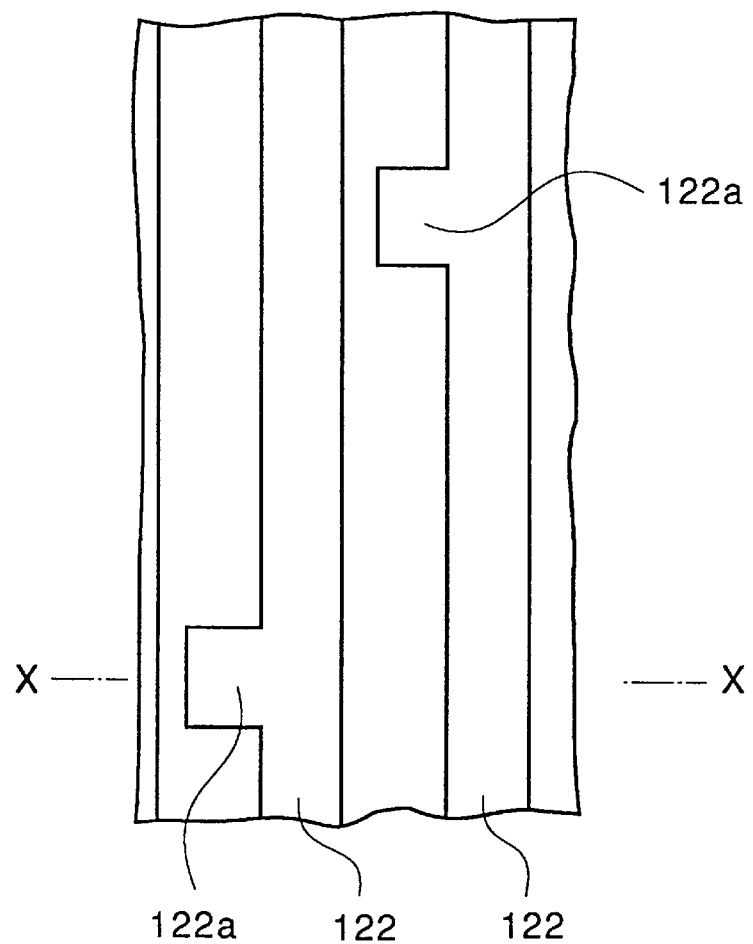
FIG. 11A is a fragmentary plane view illustrative of one step of sequential processes involved in a novel method of fabricating a memory cell according to the present invention.
Figure 11B:
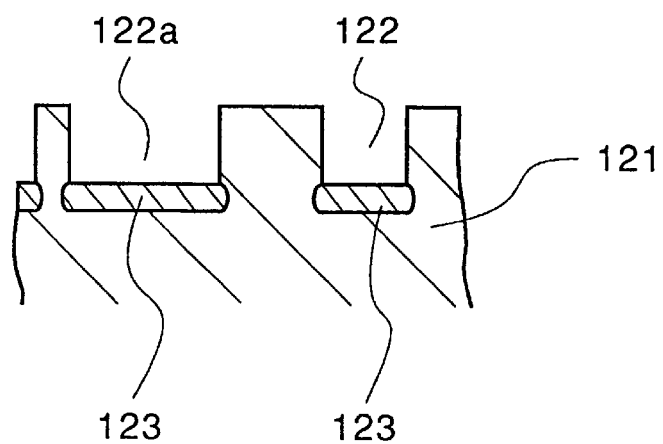
FIG. 11B is a fragmentary cross sectional elevation view illustrative of one step of sequential processes involved in a novel method of fabricating a memory cell, which is taken along the 11B—11B line in FIG. 11A.

In FIGS. 11A and 11B, a p-type silicon crystalline substrate 121 is prepared to form a memory cell. A plurality of trench grooves 122 are formed in the p-type silicon crystalline substrate 121. The trench groove 122 has a wide portion 122a. The trench groove 122 will serve as a portion of an isolation region including the bit-line 125a and the shielding line 125b. A channel stopper 123 is formed on a bottom surface of the trench groove 122.

Figure 12:
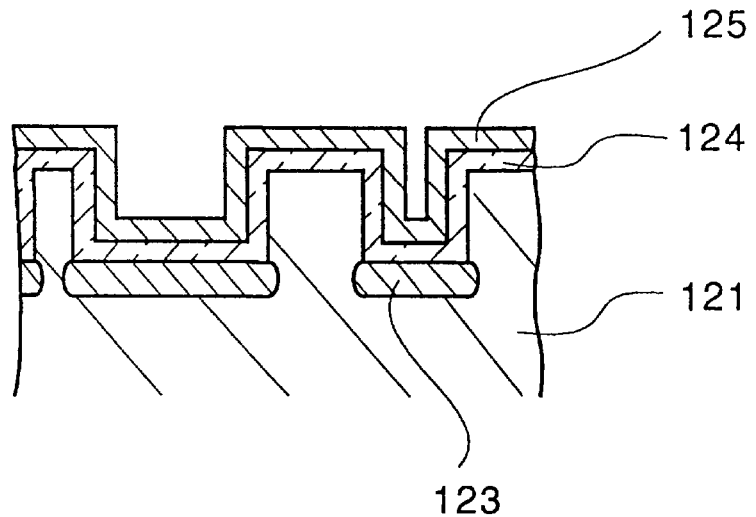
FIG. 12 is a fragmentary cross sectional elevation view illustrative of one step of sequential processes involved in a novel method of fabricating a memory cell according to the present invention.

In FIG. 12, an insulation film 124 is formed on an entire surface of the p-type silicon substrate 121, after which a polycrystalline silicon thin film 125 having a low resistance is formed on the insulation film 124.

Figure 13:
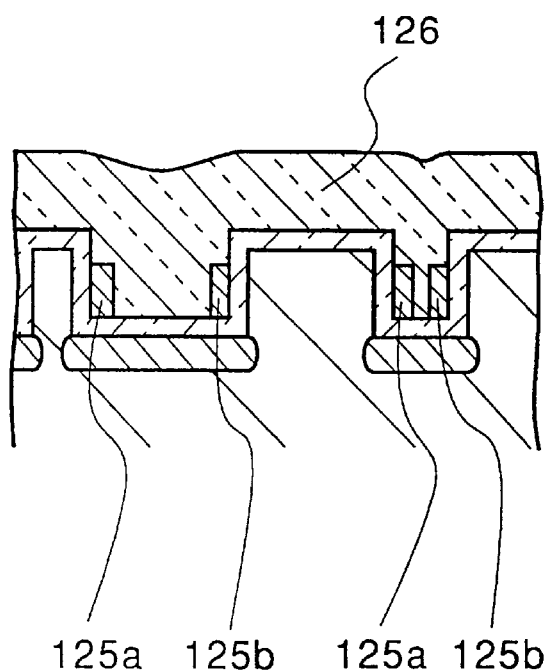
FIG. 13 is a fragmentary cross sectional elevation view illustrative of one step of sequential processes involved in a novel method of fabricating a memory cell according to the present invention.

In FIG. 13, anisotropic etching is carried out so that the polycrystalline silicon thin film 125 remains at opposite side walls of the trench groove 122. The remaining portions of the polycrystalline silicon film 125 may serve as the bit-line 125a and the shielding line 125b respectively. Subsequently, the trench groove is filled with an insulation material to form a PSG film 126.

Figure 14:
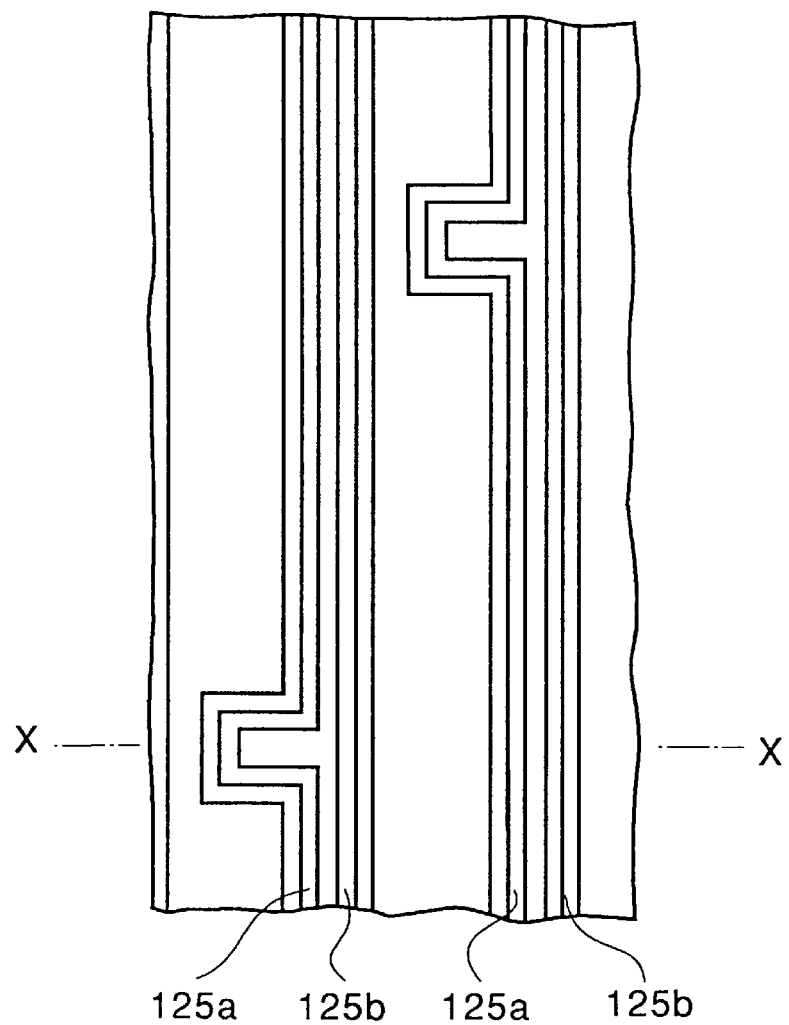
FIG. 14A is a fragmentary plane view illustrative of one step of sequential processes involved in a novel method of fabricating a memory cell according to the present invention.
FIG. 14B is a fragmentary cross sectional elevation view illustrative of one step of sequential processes involved in a novel method of fabricating a memory cell, which is taken along the 14B—14B line in FIG. 14A.
Figure 14:
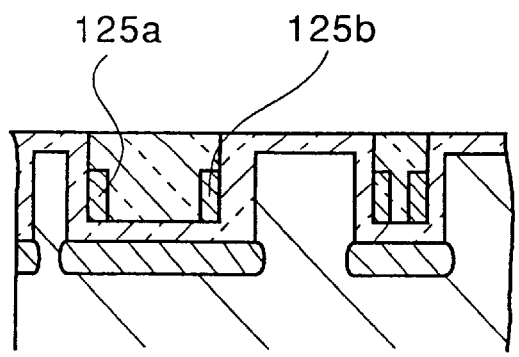
Figure 15A:
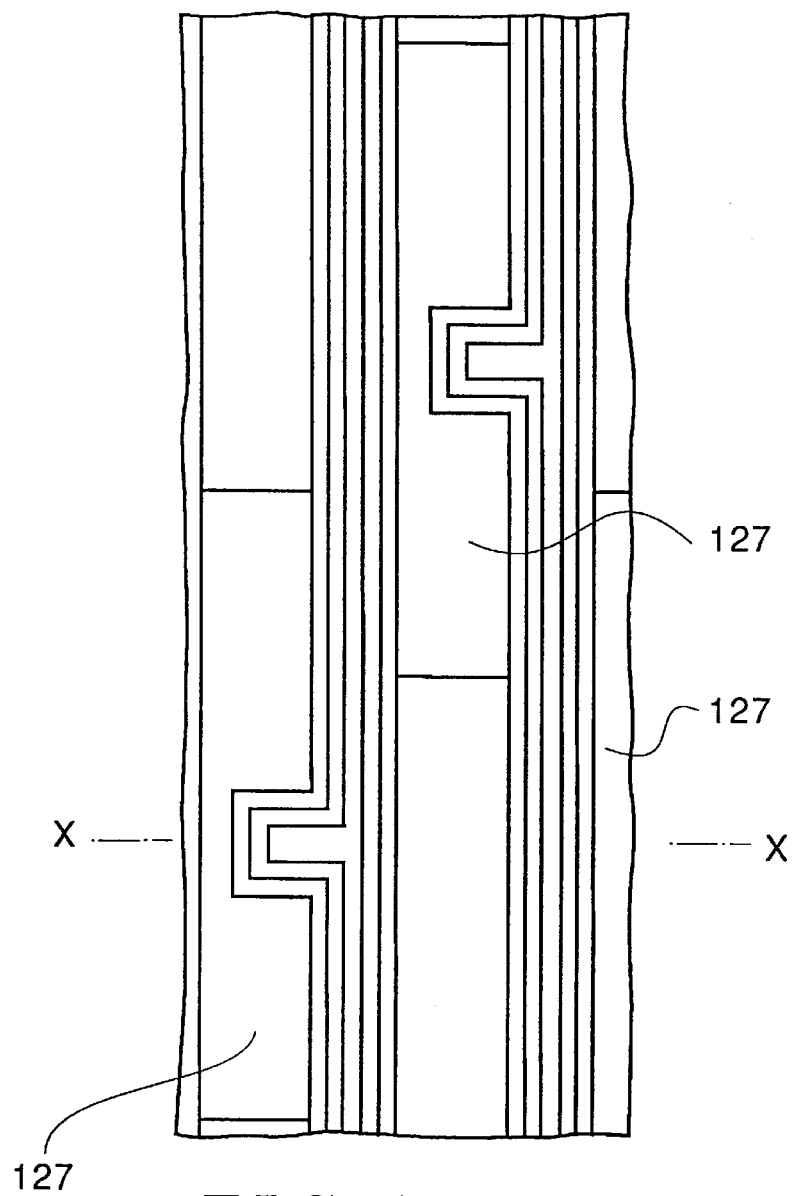
FIG. 15A is a fragmentary plane view illustrative of one step of sequential processes involved in a novel method of fabricating a memory cell according to the present invention.
Figure 15B:
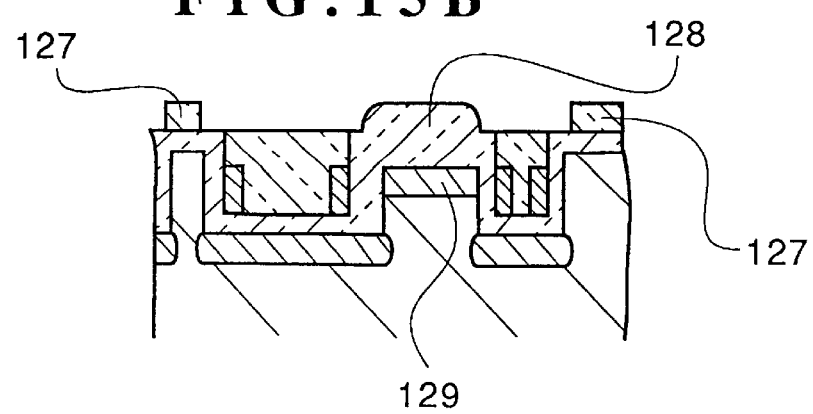
FIG. 15B is a fragmentary cross sectional elevation view illustrative of one step of sequential processes involved in a novel method of fabricating a memory cell, which is taken along the 15B—15B line in FIG. 15A.

The shielding line 125b is taken into a constant potential thereby reducing a noise caused by the parasitic capacity between bit-lines. In FIGS. 14A and 14B, a surface of the PSG film 126 is made into a flat surface followed by an etch back so that both the insulation film 124 and the PSG film 126 within the trench groove 122 remain. If a surface of the silicon substrate is exposed by the etch back, a thermal oxidization may be carried out to form a silicon oxide film. In FIGS. 15A and 15B, a silicon nitride film 127 is formed on an active area of the substrate, after which a selective oxidization is carried out to form a field oxide film 128 on an opposite area to the active area thereby defining the active area. Concurrently, a p-type channel stopper 129 is formed under the field oxide film 128.

Figure 16A:
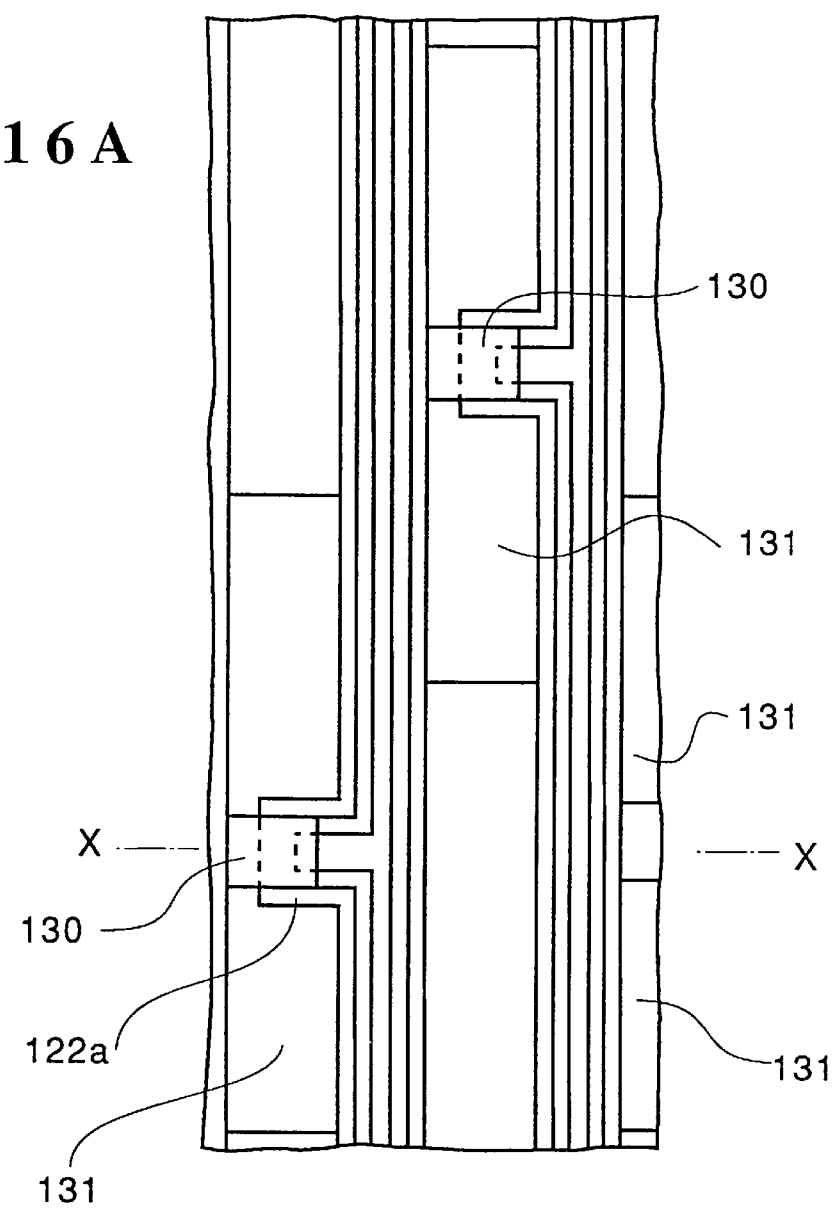
FIG. 16A is a fragmentary plane view illustrative of one step of sequential processes involved in a novel method of fabricating a memory cell according to the present invention.
Figure 16B:
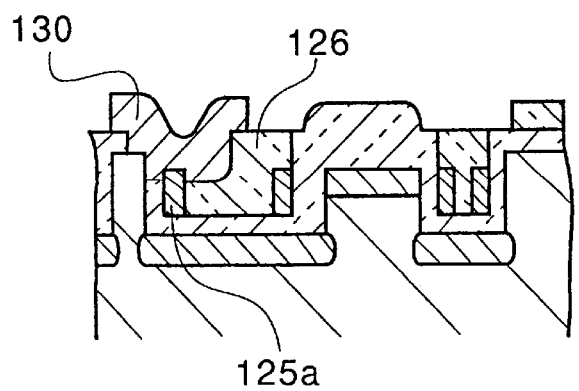
FIG. 16B is a fragmentary cross sectional elevation view illustrative of one step of sequential processes involved in a novel method of fabricating a memory cell, which is taken along the 16B—16B line in FIG. 16A.

In FIGS. 16A and 16B, the silicon nitride film 127 and the insulation film 124 of the active area are removed. Concurrently, the PSG film on the wide portion 122a of the trench groove are removed so as to expose one of the remaining polycrystalline silicon films, or the bit-line 125a. After that, a polycrystalline silicon film 130 having a low resistance which is doped with a n-type dopant is deposited on the exposure area to be made into contact with the bit-line followed by patterning.

Referring back to FIGS. 10A, 10B and 10C, a gate insulation film 132, a low resistance polycrystalline silicon film 133 serving as a word-line, n-type diffusion regions 134-1 and 134-2 serving as source/drain regions, a stacked capacitor 137, 138 and 139, an insulation film 135 are formed by normal processes respectively.

Figure 10A:
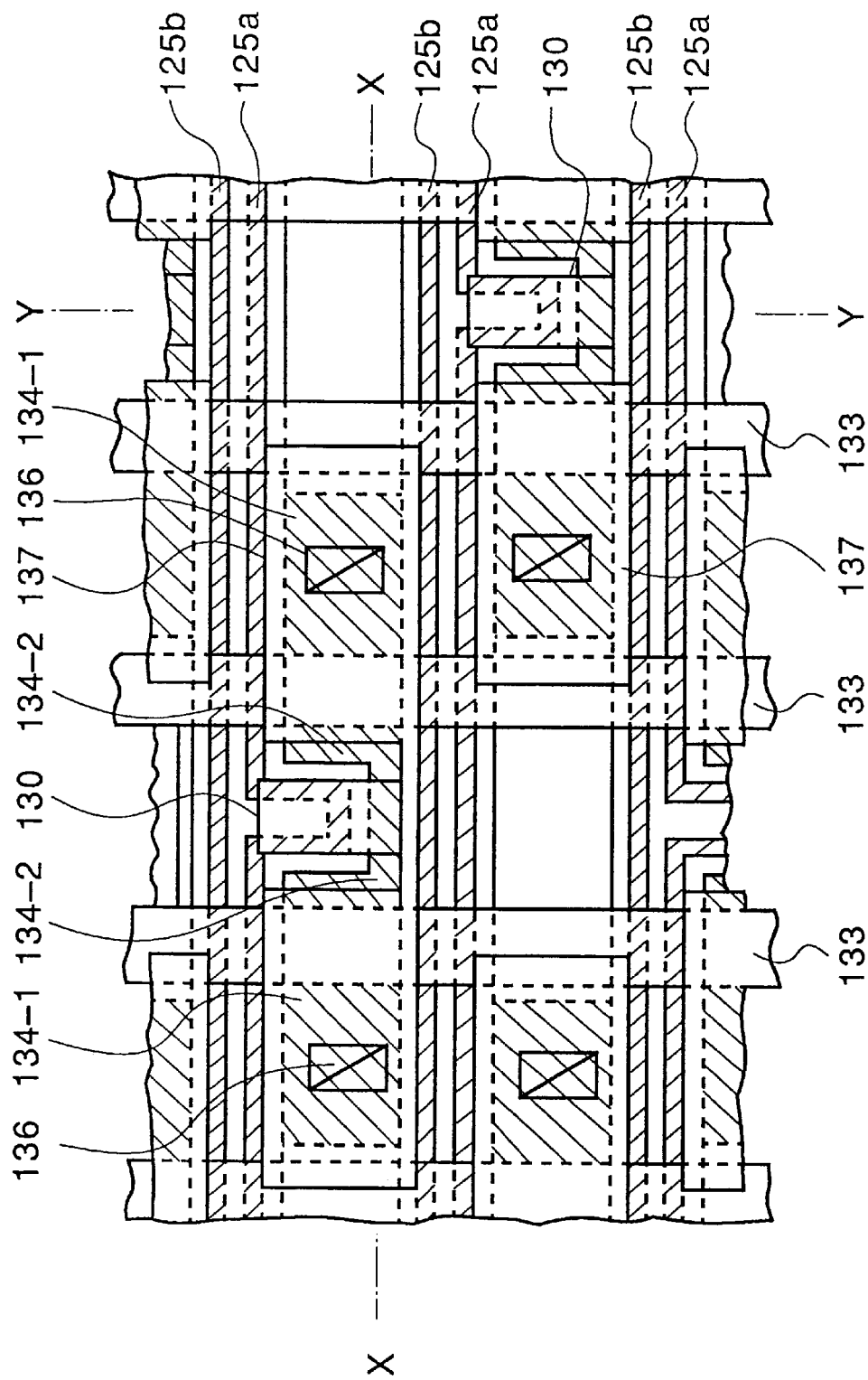
FIG. 10A is a fragmentary plane view illustrative of another novel structure of memory cells, word-lines, bit-lines and shielding lines in a memory cell array according to the present invention.
Figure 10B:
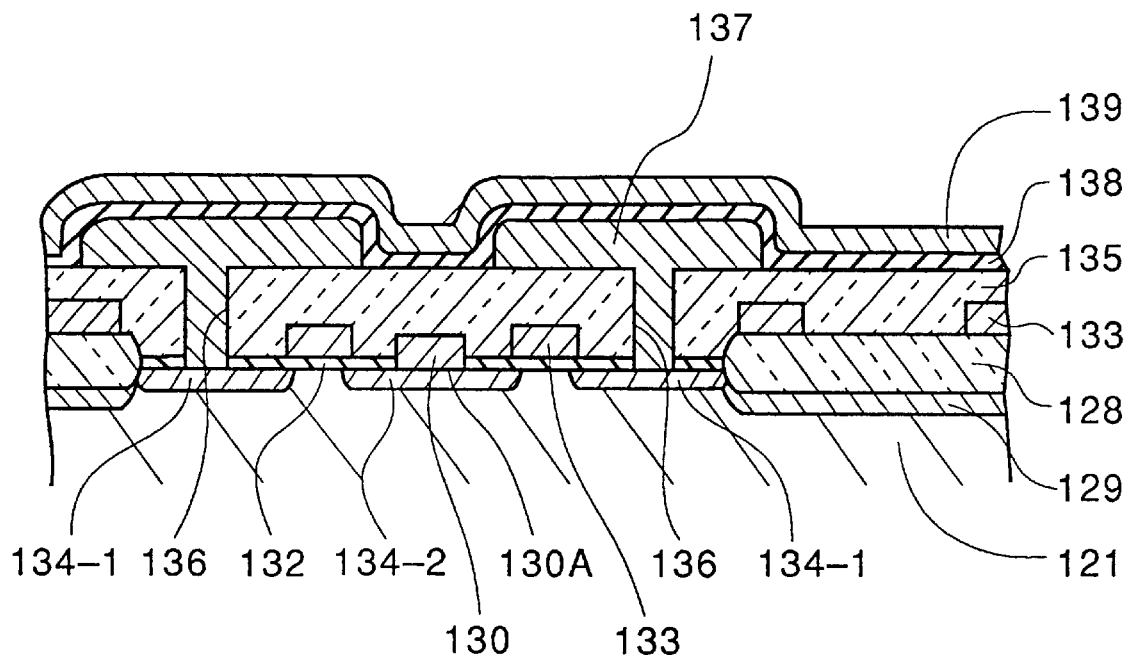
FIG. 10B is a fragmentary cross sectional elevation view illustrative of a novel memory cell structure taken along the 10B—10B line in FIG. 10A according to the present invention.
Figure 10C:
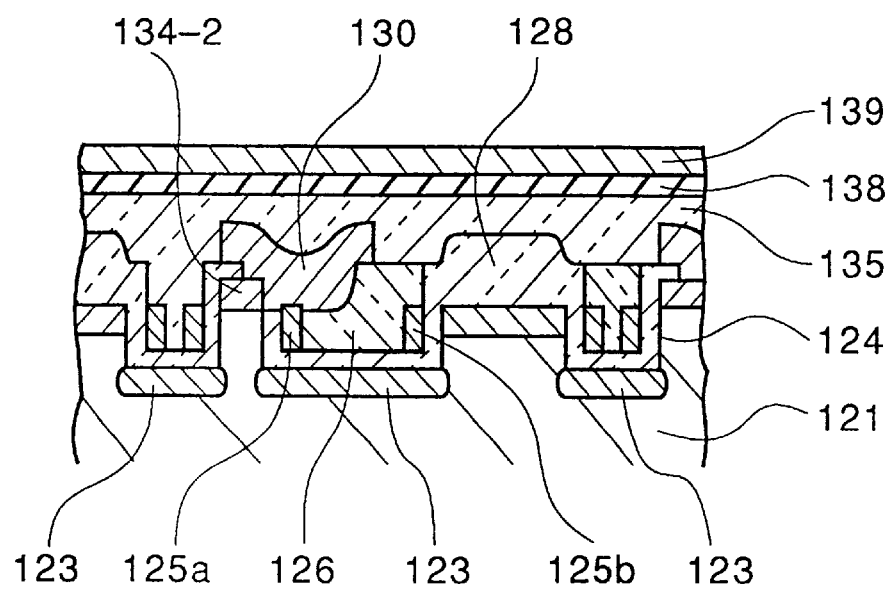
FIG. 10C is a fragmentary cross sectional elevation view illustrative of a novel memory cell, structure taken along the 10C—10C line in FIG. 10A according to the present invention.

In the structure shown in FIGS. 10A and 10B, the active area of the p-type silicon substrate 121 is defined by the field oxide film 128. A pair of source and drain regions 134-1 and 134-2 is provided in the active area of the p-type silicon substrate 121. A channel area is defined by the source and drain regions 134-1 and 134-2. The word-line 133 is provided over the channel region through the gate insulation film 132 so as to serve as a gate, thereby forming a MOS or MIS transistor used for a switching device. The source/drain region 134-1 is connected to a storage electrode 137 through a contact hole 136 filled with a conductive material. The storage electrode 137 of polycrystalline silicon is covered with a capacitive insulation film 138. A polycrystalline silicon film 139 serving as an opposite electrode overlays the capacitive insulation film 138 thereby forming a stacked capacitor. The source/drain region 134-2 is connected to the bit-line 125a through the polycrystalline silicon film 134-2 of a low resistance.

Third, there is provided a novel memory cell array including bit-lines and word-lines.

Figure 9A:
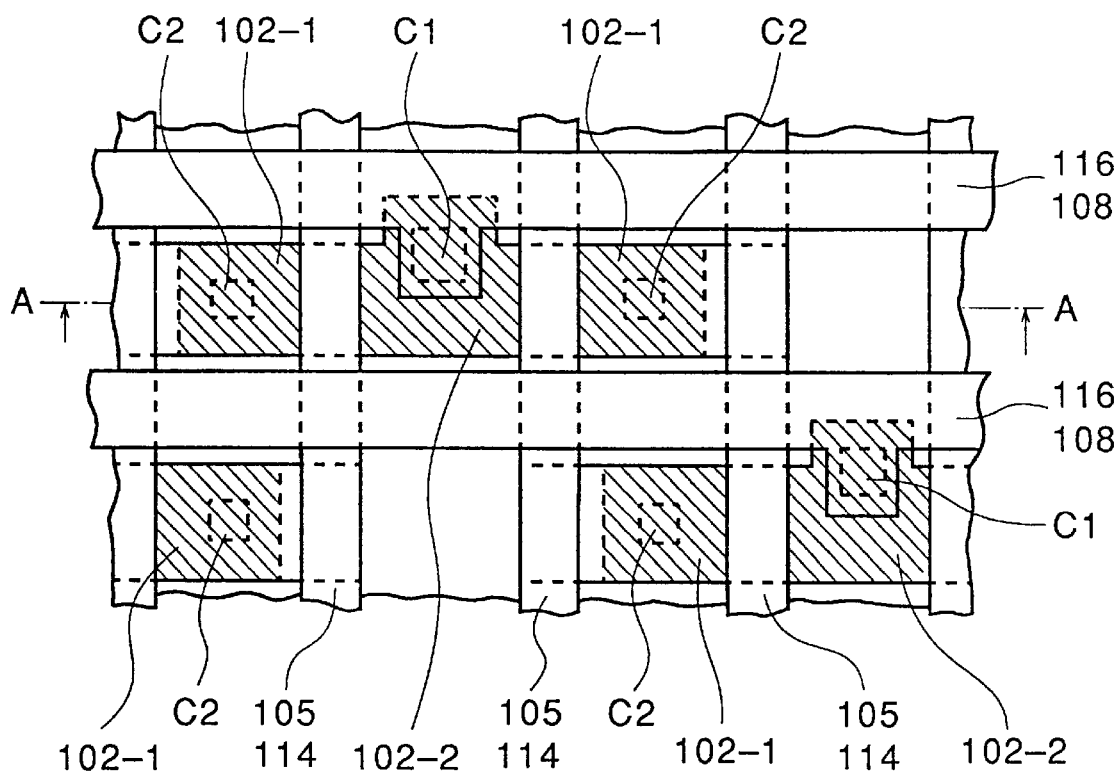
FIG. 9A is a fragmentary plane view illustrative of another novel structure of memory cells, word-lines and bit-lines in a memory cell array according to the present invention.
Figure 9B:
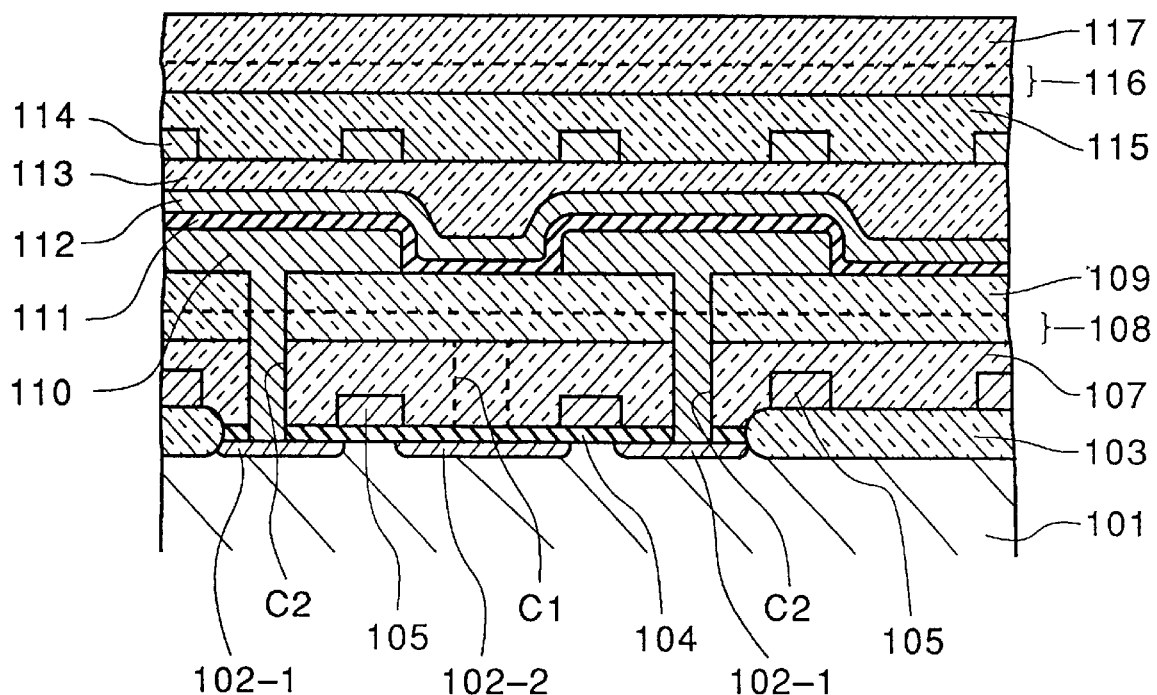
FIG. 9B is a fragmentary cross sectional elevation view illustrative of the another novel memory cell structure taken along the 9B—9B line in FIG. 9A according to the present invention.

Referring back to FIGS. 9A and 9B, a p-type semiconductor substrate 101 is prepared to form a memory cell. A field oxide film 103 is formed in a surface of the p-type semiconductor substrate 101 to define an active area. Source/drain diffusion regions 102-1 and 102-2 are formed in the active area to define a channel region by therebetween. A gate insulation film 104 overlays the active area. A word-line 105 which serves as a gate is provided over the channel region through the gate insulation film 104 thereby providing a MOS/MIS transistor as a switching device.

The word-lines 105 are arranged in columns. The word-lines 105 are also covered with an insulation film 107. A buried bit-line 108 is provided on the insulation film 107. The buried bit-line 108 is arranged in row. An insulation film 109 overlays the buried bit-line 108. Source/drain region 102-2 is connected to the buried bit-line 108 through a contact hole C1. Source/drain region 102-1 is connected to a storage electrode 110 of a capacitor through a contact hole C2. The storage electrode 110 is covered with a capacitive insulation film 111. An opposite electrode 112 of the capacitor overlays the capacitive insulation film 111 thereby providing a stacked capacitor. The opposite electrode 112 is covered with an insulation film 113 thereby forming a memory cell in a sub-array.

In addition, a plurality of sub-word lines 114 are arranged in columns on the memory cell in the sub-array. The sub-word lines 114 are also arranged directly over the word-lines 105 so as to make pairs of the word-lines 105 and the sub-word lines 114. The sub-word lines 114 are covered with an insulation film 115. A plurality of the second bit-lines 116 are arranged directly over the first bit-lines 108. The bit-lines 116 are covered with an insulation film 117.

Figure 17:
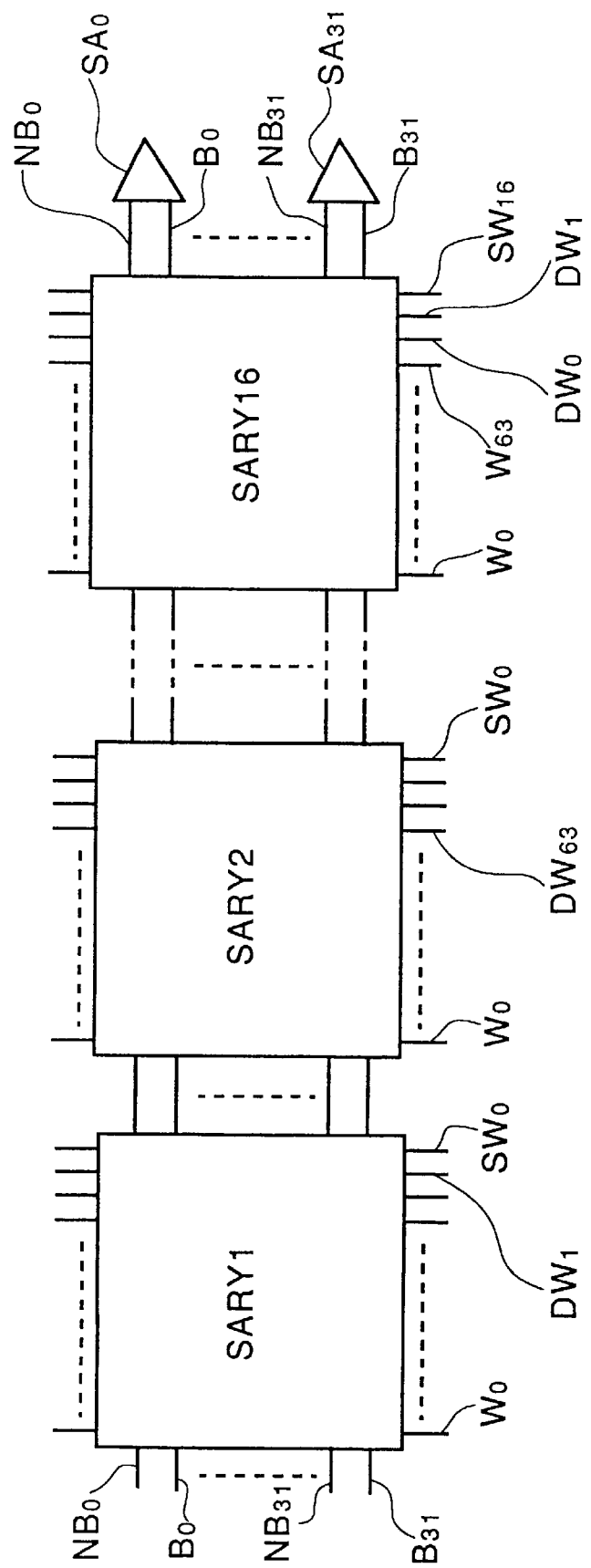
FIG. 17 is a diagram illustrative of a memory cell array including a plurality of sub-arrays according to the present invention.

In FIG. 17, a memory array according to the present invention essentially comprises sixteen sub-arrays SARY1, SARY2, . . . SARY16 which are connected each other through bit-lines $NB_0$, $B_0$, . . . $NB_{31}$ and $B_{31}$. The sub-array SARY16 is connected with thirty two sense amplifiers $SA_0$, . . . $SA_{31}$ through the bit-lines $NB_0$, $B_0$, . . . $NB_{31}$ and $B_{31}$. The word-lines are connected to a driving circuit such as an address decoder.

Figure 18:
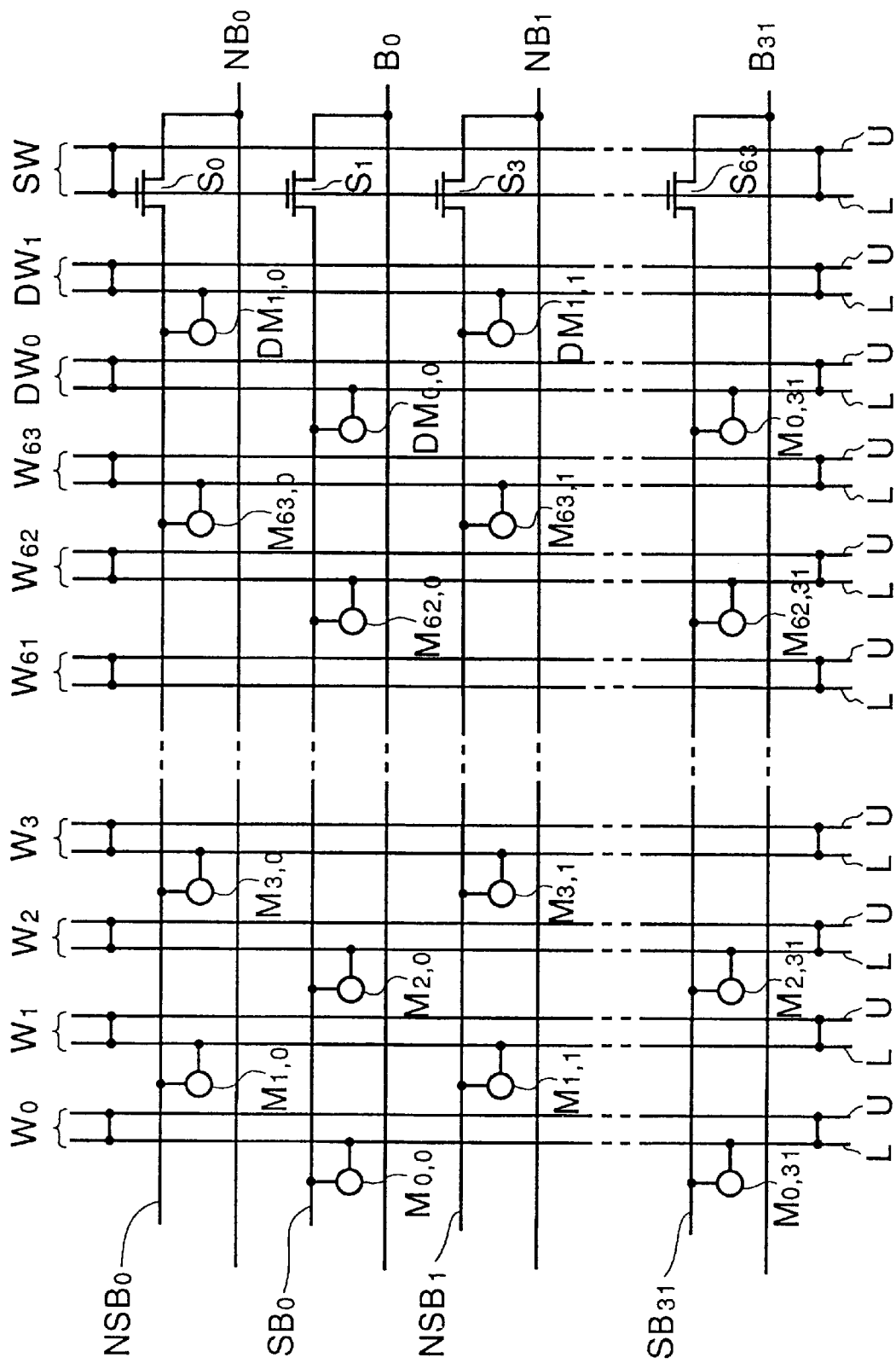
FIG. 18 is a diagram illustrative of an arrangement of memory cells, word-lines and bit-lines in a sub-array of a semiconductor memory according to the present invention.

In the sub-array illustrated in FIG. 18, the word-line L and the sub-word line U are coupled, which are directly connected each other at its opposite terminal points. Sixty four pairs of the word-lines and the sub-word lines labeled with $W_0$, $W_1$, . . . $W_{63}$ are arranged in columns. Two pairs of dummy word-lines and dummy sub-word lines labeled with $DW_0$ and $DW_1$ are also arranged in columns. The dummy word-lines and the dummy sub-word lines are directly connected each other at its opposite terminal points. Further, a pair of a sub-array selective line and a sub-array selective sub-line labeled with SW is arranged in column. The sub-array selective line and the sub-array selective sub-line are also directly connected each other at its opposite terminal points.

The buried bit-lines and the bit-lines are coupled, which are directly connected at its terminal points. The buried bit-lines exist within the sub-array only, but the sub-arrays are connected each other through the bit-lines only. Thirty two pairs of the buried bit-lines and the bit-lines labeled with $NSB_0$, $NB_0$, $SB_0$, . . . $SB_{31}$ and $B_{31}$ are respectively arranged in rows. Sixty four transistors labeled with $S_0$, $S_0$, . . . $S_{63}$ are provided at the intersections of the sub-array selective line and the buried bit-lines so as to serve as selective gates. Memory cells labeled $M_0$, . . . $M_{63,31}$ are provided at the intersections of the buried bit-lines and the word-lines. Thirty two dummy memory cells labeled with $DM_{0,0}$. . . $DM_{0,31}$ are provided at the intersections of the buried bit-lines and the dummy word-lines. Sixty four memory cells $M_{0,0}$. . . $M_{63,0}$ are alternatively provided to adjacent buried bit-lines $NSB_0$ and $SB_0$. The pairs of the bit-lines, for example, the bit-lines $NSB_0$ and $SB_0$ are buried in the single trench groove but independently from each other. The memory cells are connected alternatively to both bit-lines making a pair and electrically separated from each other. The alternate word-lines are connected to a series of the memory cells connected to one of the pair of the bit-lines. For example, the memory cells $M_{0,0}$ and $M_{2,0}$ connected to the word-lines $W_0$ and $W_2$ are connected to the bit-line $SB_0$ and the memory cells $M_{1,0}$ and $M_{3,0}$ connected to the word-lines $W_1$ and $W_3$ are connected to the bit-lines $NSB_0$.

In sub-arrays SARY2, . . . SARY16 being not selected, each of the buried bit-lines is disconnected to each of the coupled bit-lines. One buried bit-line is, therefore, provided with thirty two memory cells thereby reducing a length of the buried bit-line, by witch the undesirable parasitic capacity between the buried bit-line and the semiconductor substrate is substantially reduced. Further, the reduction of the parasitic capacity between the buried bit-line and the semiconductor substrate provides a stability of the reading out performance. Furthermore, the reduction of the buried bit-line length permits reducing the resistance, although the buried bit-line has a very small width and thickness. This permits the buried bit-line and word-line to be made of a relatively large specific resistance material. In contrast, the bit-line and the sub-word line may be made of a high conductive material such as metal or silicide thereby decreasing the bit-line and sub-word line resistance.

In addition, a pair of the word-line and the sub-word line requires a sole contact hole in each of the sub-array. A pair of the buried bit-line and the bit-line also requires a sole contact hole. This provides no undesirable influence to the high integration.

In the redding out performance of the memory array, when the sub-array selective line $SW_0$ is applied with a selective signal to take the transistors of the selective gates into ON state, the sub-array SARY1 only is taken into available state. Subsequently, the word-line $W_0$ is selected and taken from a low stete into a high state, after the dummy word-line $DW_0$ is applied with a reverse signal in order to cancel the noise of bit-line. This method has been known as the dummy reversal method. After that, voltage signals stored in the memory cells $M_{0,0}$, . . . $M_{0,31}$ connected to the word-line W are derived through the buried bit-lines $SB_0$, . . . $SB_{31}$ respectively to the selective gates. Further, the signal are respectively derived through the bit-lines $B_0$, . . . $B_{31}$ to the sense amplifiers $SA_0$, . . . $SA_{31}$, followed by amplifying of the signals thereby carrying out the reading out performance.

The materials, dimensions of the memory cells and the number of elements such as sub-arrays, memory cells, word-lines, bit-lines and the others may greatly be varied by matching the conditions.

Whereas modifications of the present invention will no doubt be apparent to a person of ordinary skilled in the art, it is to be understood that the embodiments shown and described by way of illustration are by no means intended to be considered in a limiting sense. Accordingly, it is to be intended by the claims to cover all modifications of the invention which fall within the sprite and scope of the invention.

What is claimed is:

1. A method of forming a buried bit-line in a memory cell comprising the steps of:

forming a groove in a semiconductor substrate;

forming a channel stopper layer on a bottom surface of said groove;

forming an insulation film on at least opposing side walls of said groove;

forming a conductive film on at least said insulation film in said groove;

subjecting said conductive film to anisotropic etching so that said conductive film remains only at said opposite side walls of said groove thus forming conductive films remaining on said opposite side walls of said groove; and filling said groove with an insulation material thereby isolating said conductive films remaining on said opposite side walls of said groove, wherein said conductive films remaining on said opposite side walls of said groove serve as a bit-line and a noise shielding line, respectively.

2. A method of forming a buried bit-line in a memory cell as claimed in claim 1, wherein said conductive film is formed by chemical vapor deposition.

3. A method of forming a buried bit-line in a memory cell as claimed in claim 2, wherein said conductive film has a thickness of approximately 10 nanometers.

4. A method of forming a buried bit-line in a memory cell as claimed in claim 1, wherein said conductive film has a width of approximately 50 nanometers.

5. A method of forming a buried bit-line in a memory cell as claimed in claim 1, wherein said conductive film is made of polycrystalline silicon.

6. A method of forming a buried bit-line in a memory cell as claimed in claim 1, further comprising the step of forming a channel stopper layer in said substrate adjacent to said insulation film on at least one of said opposing side walls of said groove.

7. A method of forming a buried bit-line in a memory cell comprising the steps of:

forming a groove in a semiconductor substrate, wherein said groove has wider portions which are wider than active area portions at at least one active area of said memory cell;

forming an insulation film on at least opposing side walls of said groove;

forming a conductive film on at least said insulation film in said groove;

subjecting said conductive film to anisotropic etching so that said conductive film remains only at said opposite side walls of said groove thus forming conductive films remaining on said opposite side walls of said groove; and filling said groove with an insulation material thereby isolating said conductive films remaining on said opposite side walls of said groove, wherein said conductive films remaining on said opposite side walls of said groove serve as a bit-line and a noise shielding line, respectively.

8. A method of forming a buried bit-line in a memory cell as claimed in claim 7, further comprising the steps of assuring at least part of said conductive films remaining on one side wall of said groove is exposed through said insulation material; and forming a conductive layer on a surface of said semiconductor substrate and in contact with said at least part of said conductive film remaining on one side wall of said groove.

9. A method of forming a buried bit-line in a memory cell as claimed in claim 8, wherein said conductive layer, which is on a surface of said semiconductor substrate and in contact with said at least part of said conductive films remaining on one side wall of said groove, connects to a current carrying electrode of a transistor in said memory cell.

\* \* \* \* \*